United States Patent [19]
McGrath et al.

[11] Patent Number: 5,461,634
[45] Date of Patent: Oct. 24, 1995

[54] MEMORY STORAGE VERIFICATION SYSTEM FOR USE IN AN INTEGRATED CIRCUIT FOR PERFORMING POWER SIGNAL MEASUREMENTS

[75] Inventors: Donald T. McGrath, Scotia; Joseph E. Krisciunas, Clifton Park, both of N.Y.

[73] Assignee: General Electric Company, Schenectady, N.Y.

[21] Appl. No.: 36,742

[22] Filed: Mar. 25, 1993

[51] Int. Cl.$^6$ .............................. G06F 7/02; H04L 1/00
[52] U.S. Cl. .................. 371/67.1; 371/51.1; 371/21.2
[58] Field of Search .............................. 371/67.1, 51.1; 395/400, 425; 364/956.1, 253.1

[56] References Cited

U.S. PATENT DOCUMENTS

| | | | |
|---|---|---|---|
| 3,171,349 | 3/1965 | Kodis et al. | 371/67.1 |
| 3,422,406 | 1/1969 | Stahle | 371/67.1 |
| 4,547,726 | 10/1985 | Premerlani | 324/782 |
| 4,715,000 | 12/1987 | Premerlani | 364/484 |
| 4,723,216 | 2/1988 | Premerlani | 364/484 |
| 4,896,156 | 1/1990 | Garverick | 341/143 |
| 4,931,993 | 6/1990 | Urushima | 365/189.01 |
| 4,951,052 | 8/1990 | Jacob et al. | 341/122 |
| 5,014,195 | 5/1991 | Farrel et al. | 395/425 |
| 5,126,961 | 6/1992 | Garverick | 364/724.1 |
| 5,134,578 | 7/1992 | Garverick et al. | 364/572 |
| 5,181,033 | 1/1993 | Yassa et al. | 341/143 |
| 5,249,188 | 9/1993 | McDonald | 371/68.3 |
| 5,274,648 | 12/1993 | Eikill | 371/21.2 |
| 5,392,302 | 2/1995 | Kemp | 371/51.1 |

OTHER PUBLICATIONS

"A Use of Limit Cycle Oscillations to Obtain Robust Analog–to–Digital Converters," James C. Candy, IEEE Transactions on Communications, vol. COM–22, No. 3, pp. 298–305, Mar., 1974.
"A Programmable Mixed Signal ASIC for Power Management," D. McGrath, P. Jacob, H. Sailer, IEEE 1992 Custom Integrated Circuits Conference, pp. 19.4.1–19.4.3.
"Using Triangularly Weighted Interpolation to Get 13–Bit PCM from a Sigma–Delta Modulator," James C. Candy, Y. C. Ching, D. S. Alexander, IEEE Transactions on Communications, pp. 1268–1275, Nov., 1976.
"A Programmable Mixed–Signal ASIC for Power Metering," S. L. Garverick, D. T. McGrath, R. D. Baertsch, K. Fujino, 1991 IEEE International Solid State Circuits Conference, Digest of Technical Papers, pp. 36–37.
"A Programmable Mixed–Signal ASIC for Power Metering," S. L. Garverick, K. Fujino, D. T. McGrath, R. D. Baertsch, IEEE Journal of Solid–State Circuits, vol. 26, No. 12, pp. 2008–2016, Dec. 1991.
"Measuring Electrical Parameters of Power Line Operation, Using a Digital Computer," Garverick et al., Patent Application Serial No. 07/728,408, (GE Docket No. RD–21,093), filed Jul. 11, 1992. (Not enclosed).
"Plural–Channel Decimation Filter, as for Sigma–Delta Analog–to–Digital Converters," S. L. Garverick, Patent Application Serial No. 07/726,443, (GE Docket No. 21,444, C–I–P of U.S. Patent 5,126,961 (RD–21,091). (Not enclosed).
"Data Acquisition Systems with Programmable Bit–Serial Digital Signal Processors," Garverick et al., Patent Application Serial No. 07/653,935, (GE Docket No. RD–20,882), filed Feb. 11, 1991. (Not enclosed).

Primary Examiner—Robert W. Beausoliel, Jr.
Assistant Examiner—Glenn Snyder
Attorney, Agent, or Firm—Enrique J. Mora; Marvin Snyder

[57] ABSTRACT

A memory storage verification device for use with a memory storage unit in which electrical signals stored in selected memory locations are periodically accessed by an external processor. The device includes a register for storing the address of a memory location in the memory storage unit having a stored electrical signal, a comparator for comparing the address stored in the register with an electrical signal from the memory storage unit providing the address of the memory location being accessed by the external processor, and a latch including a trigger coupled to the output port of the comparator. The input port of the latch is coupled to the memory storage unit and receives the electrical signal stored in the memory location being accessed when the trigger receives a signal from the comparator.

13 Claims, 6 Drawing Sheets

MEMORY STORAGE VERIFICATION SYSTEM FOR USE IN AN INTEGRATED CIRCUIT FOR PERFORMING POWER SIGNAL MEASUREMENTS

RELATED APPLICATIONS

This application is related to patent application Ser. No. 08/025,456 entitled "Programmable Decimation Filter," by Krisciunas et al., filed Mar. 3, 1993 patent application Ser. No. 08/036,743 entitled "Programmable Digital Signal Processor For Processing Electrical Power Signal Measurements," by McGrath et al., filed Mar. 25, 1993 patent application Ser. No. 07/653,935 (RD-20,882), entitled "Data Acquisition Systems with Programmable Bit-Serial Digital Signal Processors," by Garverick et al., filed Feb. 11, 1991, patent application Ser. No. 07/726,443 (RD-21,444), continuation-in-part of U.S. Pat. No. 5,120,961, (RD-21,091), entitled "Plural-Channel Decimation Filter, as for Sigma-Delta Analog-to-Digital Converters," by Garverick issued Jun. 30, 1992 and patent application Ser. No. 07/728,408 (RD-21,093), entitled "Measuring Electrical Parameters of Power Line Operation, Using a Digital Computer," by Garverick et al., filed Jul. 11, 1992, all assigned in whole or in part to the assignee of the present invention and herein incorporated by reference.

FIELD OF THE INVENTION

This invention is related to memory storage devices and, more particularly, to enhancing the reliability of electrical signals stored in such memory storage devices.

BACKGROUND OF THE INVENTION

In the field of power measurement, metering, and management, a need exists to have the capability to reduce large amounts of data at remote sites over long periods of time and to transmit that reduced data via communication lines to a central site or, alternatively, to store the reduced data at the site for later analysis. Problems associated with having the capability for such data reduction at remote sites include both how to achieve the flexibility to perform different types of data reduction and how to maintain the reliability and integrity of the devices or programs performing the data reduction. Such flexibility generally requires a programming capability, typically obtained by employing programmable devices; however, in the environment of power measurement, metering and management, remote locations or sites are particularly vulnerable to data collection and data reduction problems from power supply anamolies, ionized radiation, and other device environment-related problems that may affect devices providing such programmability, such as random access memories. Likewise, because this data collection and reduction may be performed over long periods of time, including years, such errors may not be discovered until long after any "damage," in terms of the production of meaningless or useless data, has already taken place.

One approach would employ read only memories (ROM's) at such remote sites. However, such an approach limits flexibility and may introduce additional expense because typically a different ROM is necessary for each different program. Another approach would attempt to verify the integrity of the stored electrical signals. One known technique for verifying such stored electrical signals is a "checksum." Such a technique has several difficulties, however. First, it will not necessarily permit a complete verification because errors may offset each other. Second, it may be time consuming or burdensome to execute regularly or periodically. Thus, a need exists for a method or system for maintaining the integrity and reliability of electrical signals stored in various memory locations of a programmable memory storage device located at a remote site.

SUMMARY OF THE INVENTION

One object of the invention is to provide a memory storage verification system that provides the capability to completely verify the electrical signals stored in a programmable memory storage device at a remote location or site.

Another object of the invention is to provide a memory storage verification system in which verification of electrical signals stored in a memory storage device may take place without interrupting the operation of a signal processor or external microprocessor coupled to the memory storage device and utilizing the stored electrical signals.

One more object of the invention is to provide a memory storage verification system that may be incorporated into a monolithic electronic integrated circuit chip or component along with the programmable memory storage device storing the electrical signals and with a signal processor coupled to the memory storage device.

Yet another object of the invention is to provide a programmable memory storage verification system in which the system may be placed in operation at a remote location for an extended period of time, including years.

Briefly, in accordance with one embodiment of the invention, a memory storage verification system for use with a memory storage unit in which electrical signals stored in selected memory locations are periodically accessed by an external processor, comprises: a register for storing the address of a memory location in the memory storage unit having a stored electrical signal, a comparator for comparing the address stored in the register with an electrical signal from the memory storage unit providing the address of the memory location being accessed by the external processor, and a latch including a trigger coupled to the output port of the comparator, the input port of the latch being coupled to the memory storage unit and being adapted to receive the electrical signal stored in the memory location being accessed when the trigger receives a signal from the comparator.

BRIEF DESCRIPTION OF THE DRAWINGS

The subject matter regarded as the invention is particularly pointed out and distinctly claimed in the concluding portion of the specification. The invention, however, both as to organization and method of operation, together with further objects and advantages thereof, may best be understood by reference to the following detailed description when read with the accompanying drawings in which:

DETAILED DESCRIPTION OF THE INVENTION

Figure 1:
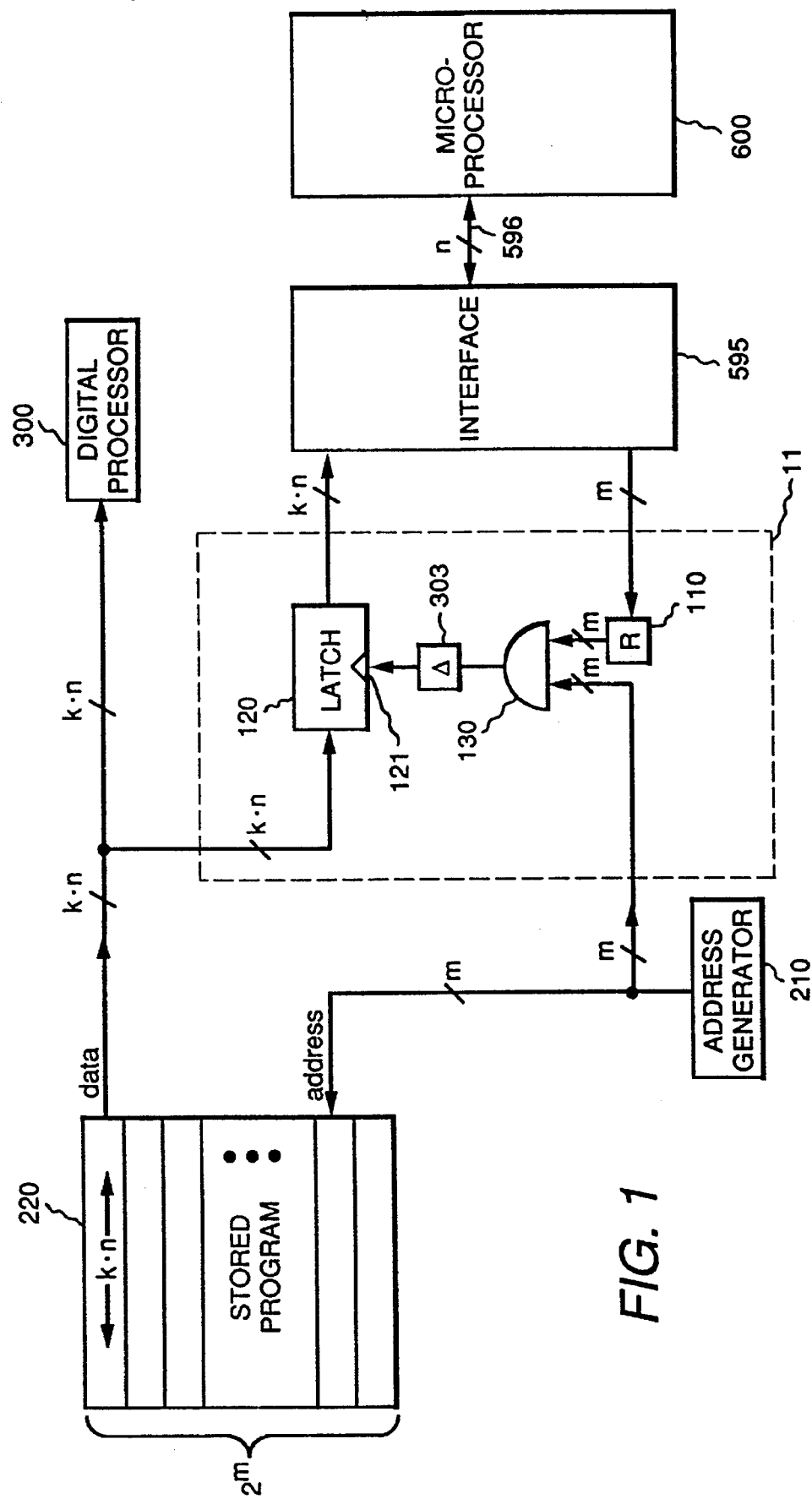
FIG. 1 is a schematic diagram illustrating one embodiment of a memory storage verification device or system in accordance with the invention.

FIG. 1 illustrates a memory storage verification device or system 11 for verifying stored electrical signals. The device or system is typically employed with a memory unit or memory storage device, such as a random access memory 220, in which electrical signals stored in selected memory units are periodically accessed, such as may occur for the memory units described in co-pending patent application Ser. No. 08/036,743. In the context of the invention, accessing stored electrical signals refers to transmission of the signals to a device or unit external to the memory unit or storage device, such as a digital processor 300 in FIG. 2. In the embodiment illustrated in FIG. 1, each memory location is adapted to store an electrical binary signal comprising k.n bits or binary signals. This may include, for example, a single bit or binary signal, or alternatively a 32 bit word. In this particular embodiment, n refers to the width of a data bus 596 providing a means of communication between an external microprocessor 600 and an interface unit 595, the interface unit providing communication between device 11 and the microprocessor. Likewise, each location may store n bits out of a k.n bit word. Thus, the electrical binary signal comprising k.n bits may be stored in multiple, typically consecutive, memory locations. A memory storage verification device or system in accordance with the present invention may thus encompass bit serial processing, parallel processing, or a combination thereof, as described hereinafter.

As described in patent application Ser. No. 08/036,743, signal processors for use in power metering, measurement and management are typically placed at remote locations or sites for long periods of time and are susceptible to ionized radiation, power supply problems, and other environment related difficulties that may ultimately affect the integrity of the stored electrical signals and likewise the output signals provided by the signal processor. These signal processors may operate for long periods of time, including years, in which data may be collected, reduced, and ultimately transmitted by communication lines or, alternatively, the data may be stored at the location and later analyzed. Thus, a need exists to continually monitor the stored electrical signals to ensure that no errors in the stored electrical signals are present or induced by the environment of the power measurement system. Likewise, complete signal verification is desired due to the significant effects of even a single error in a stored electrical signal on the power measurement data or signals obtained. In addition, memory storage verification should be performed in a manner so that it does not burden the primary operation of the microprocessor or signal processor provided at the remote location performing or assisting in the data reduction. Finally, the capability must exist to correct detected errors or deficiencies in the stored electrical signals in a quick and timely fashion so that no power measurement data is omitted or lost during correction of the stored electrical signals, or so that the amount of data omitted is minimal and thus has negligible impact on data reduction. It will be appreciated that some of these problems are not typically associated with the use of read-only memories (ROM's); however, such ROM's significantly reduce programing flexibility and introduce additional costs when the "program" requires modification or adaption.

As illustrated in FIG. 1, device 11 is coupled to random access memory 220, such as may correspond to memory unit 20 described in co-pending patent application Ser. No. 08/036,743. Memory unit 220, like the memory unit in the aforesaid patent application, is primarily dedicated to storing binary electrical signals to control digital processor 300, which may comprise a multiply-accumulate processor. Nonetheless, the invention is not limited in scope to being coupled to a multiply-accumulate processor. For example, device 11 may be coupled to a conventional digital signal processor or to digital logic circuitry configured to perform predetermined digital operations in response to predetermined digital input signals and the "state" of the digital circuitry when the input signals are received. The "program" of stored control signals in memory unit 220 may typically be executed repeatedly. Consequently, if an error were to occur in the stored electrical signals it would have a significant detrimental impact on the data processing performed by the signal processor. Likewise, other memory units may store binary electrical signals needing verification, such as signals providing the coefficients for use in digital signal processing. Advantages may thus be gained by maintaining the integrity of these signals stored in other memory units (not shown) as well.

FIG. 1 shows memory unit 220 coupled to processor 300 and a latch 120, latch 120 being incorporated in device 11, as illustrated. As described, the processor may take any one of a number of possible embodiments, such as the embodiment described in co-pending patent application Ser. No. 08/036,743. Thus, a power metering, measurement or management system may comprise a memory storage verification system, in accordance with the present invention, in association with a programmable digital signal processor system, as described in copending patent application Ser. No. 08/036,743. FIG. 1 also illustrates communication lines for transferring k.n bits or binary signals from device 11 to external microprocessor 600 and m bits from microprocessor 600 to device 11. As illustrated, a set of communication lines between device 11 and interface 595 provides the capability to transfer m binary signals from microprocessor 600 to register 110 within device 11 and a second set provides the capability to transfer k.n binary signals from latch 120 to microprocessor 600. Nonetheless, the k.n and m binary signals are respectively transferred between microprocessor 600 and an interface 595, n bits or binary signals at a time. The number m may be greater than n by transferring successive sets of n binary signals. Thus, greater speed in data transfer may be accomplished at the cost of additional hardware to ensure that m is less than or equal to n. It will be appreciated that typically a microprocessor interface, such as interface 595, will coordinate the transfer of electrical signals between device 11 and microprocessor 600, although some embodiments may not include such an interface.

As illustrated, device 11 comprises an m bit register 110 for storing the address of a memory location having a stored electrical signal to be verified. Register 110 is coupled to a comparator 130 for comparing the address stored in register 110 with an electrical signal from an address generator 210 providing the memory address location being accessed by the memory unit. Depending upon the particular embodiment, register 110 and comparator 130 may operate in serial or in parallel. In this embodiment, in which some parallel processing is contemplated, comparator 130 may comprise a parallel comparator, such as a plurality of logical AND gates coupled to circuitry to coordinate timing.

As should be clear to one skilled in the relevant art, in the context of the invention the digital processor is continually in operation and accesses electrical signals from various memory locations periodically. Thus, a device for generating electrical signals providing the memory address location being accessed from the unit at any particular time is illustrated coupled to memory unit 220. In the embodiment illustrated in FIG. 1, electrical signals providing the memory address location being accessed in memory unit 220 are provided by a memory location address generator, such as a conventional program counter 210, although the invention is not limited in scope to obtaining the memory location being accessed in this manner. Counter or generator 210 merely illustrates the operation of one particular embodiment of the invention. Nonetheless, counter 210 comprises an m bit counter so that it may address $2^m$ memory locations in memory unit 220. Thus, in this embodiment memory unit 220 comprises a random access memory of $2^m$ memory locations, each capable of storing k.n binary signals or bits.

As illustrated, comparator 130 has an output port coupled to a trigger 121 of latch 120. Thus, when address generator or program counter 210 provides a memory address location that matches the memory address location stored in register 110, the comparator provides a signal to latch 120. Likewise, as illustrated, the input port of the latch is coupled to the output port of memory unit 220 that is also coupled to processor 300. Comparator 130 is coupled to latch 120 through a time delay or time delay device 303 to reflect the duration or interval between the time when a memory location address match is detected by comparator 130 and the time when the electrical signals stored in the matched location are accessed by or transferred to processor 300. It will be understood that the time delay is chosen to synchronize the completion of the comparison performed by comparator 130 with the accessing performed by processor 300 of the electrical signals stored in the memory location corresponding to the memory address location provided by address generator 210. Thus, when comparator 130 provides a signal to latch 120 the latch receives the electrical signal stored in the memory location being accessed from memory unit 220 and provided to processor 300. The stored electrical signals provided to processor 300 and latch 120 may be provided in serial or in parallel depending upon the particular embodiment. As illustrated in the embodiment of FIG. 1, k.n binary signals or bits are provided in parallel to latch 120.

A number of possible embodiments are available for latch 120. Latch 120 in this embodiment comprises a k.n bit latch having the capability to receive and latch k.n binary signals or bits in parallel, such as a plurality of flip-flops properly synchronized to receive the transmitted binary signals. As illustrated, latch 120 is coupled to microprocessor 600 via interface 595. Thus, the electrical signals transferred to the latch are then provided to the microprocessor so that the microprocessor may verify the electrical signals stored in the memory location accessed. As illustrated, register 110 receives the address of the memory location whose stored electrical signal is to be verified by microprocessor 600. Thus, in the embodiment illustrated in FIG. 1, no timing signals to synchronize or coordinate the operation of device 11 with microprocessor 600 are required. This provides an advantage over other possible embodiments in that it requires less hardware, making it smaller, lighter and more cost-effective. Thus, in operation, it is assumed that memory unit 220 includes a program of stored electrical signals to be regularly or periodically repeated. Thus, at a typical rate of operation for completing one cycle of a predetermined program of stored instructions, such as on the order of 4,883 kilohertz, each memory location will be assured of being accessed within approximately 0.2 milliseconds. Thus, microprocessor 600 need only verify the contents of register 120 after 0.2 milliseconds or the otherwise applicable time period. Once microprocessor 600 verifies the stored electrical signals, another memory location address is provided to register 110 by the microprocessor.

Device 11 provides many advantages. Use of the device, as illustrated, avoids the need to interrupt the operation of the microprocessor or memory unit at any time in order to confirm or verify that the appropriate electrical signals are stored. Likewise, the burden on the microprocessor is minimal. Only a small portion of its computational capabilities are utilized by this operation. Furthermore, device 11 ensures that a complete verification of the stored electrical signals is performed. In addition, device 11 offers great efficiency in that only selected memory locations need be verified rather than all of the memory locations in the memory storage device.

Figure 2:
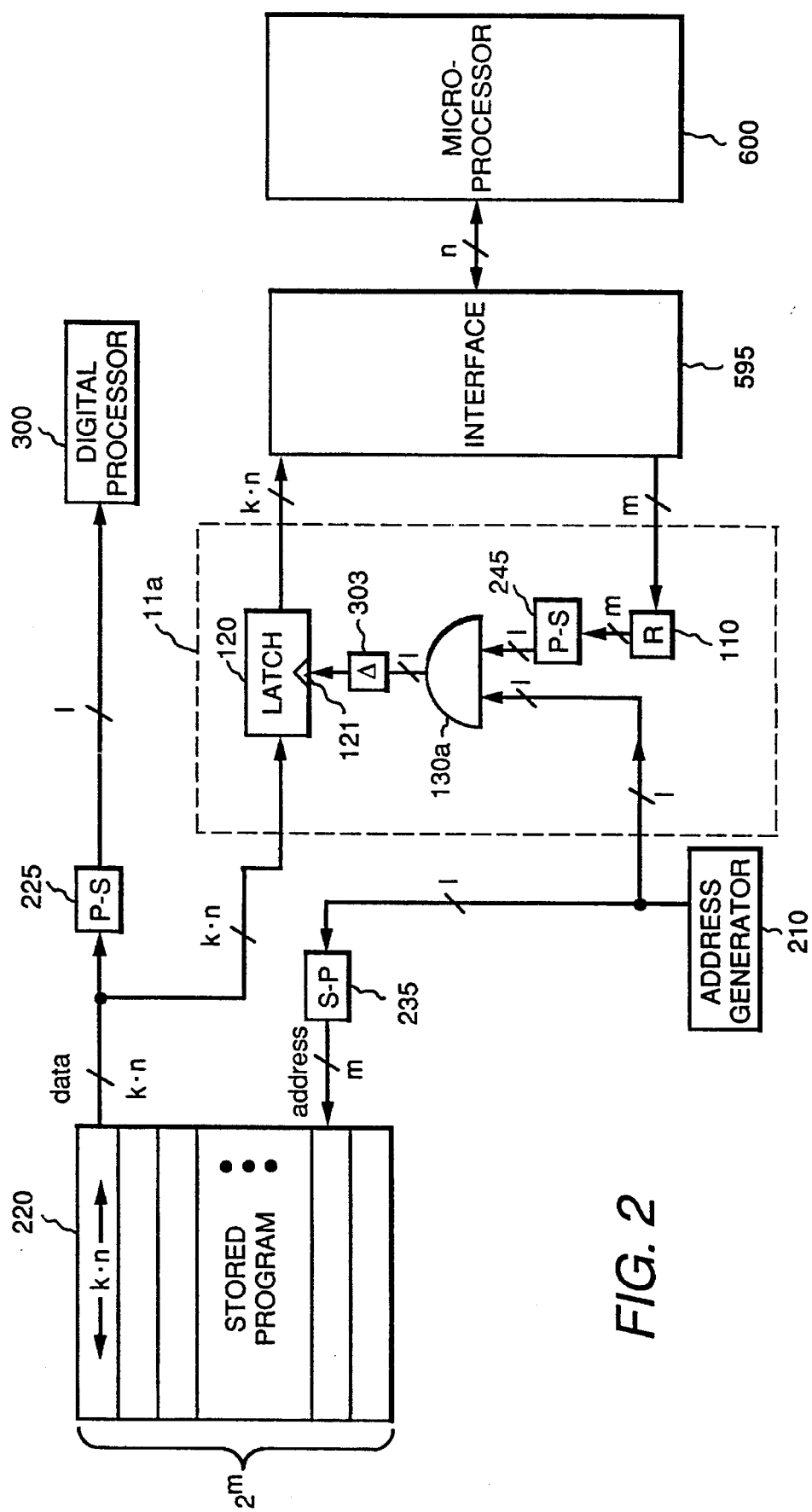
FIG. 2 is a schematic diagram illustrating an alternative embodiment of a memory storage verification device or system in accordance with the invention.

FIG. 2 illustrates an alternative embodiment of a memory verification device 11a in accordance with the present invention. As illustrated in FIG. 2, device 11a is similar to the embodiment illustrated in FIG. 1 except that this embodiment is intended for serial bit processing rather than parallel processing. Thus, as illustrated, a parallel-to-serial converter interface 225 is provided at the output port of memory unit 220. Likewise, a serial-to-parallel converter interface 235 is provided at the couple to the output of address generator 210 so that memory unit 220 may be addressed in parallel rather than in serial. Thus, in this particular embodiment, to coordinate timing, generator 210 provides or generates memory location addresses serially. Likewise, in this particular embodiment, processor 300 is a serial bit processor rather than a parallel processor.

The operation of device 11a is much like the operation previously described with respect to device 11 in FIG. 1 except for the aspects related to serial bit processing. Thus, the memory address to be verified is provided to register 110. In this particular embodiment, interface 595 provides that memory address in parallel. (However, as illustrated in FIG. 2, the memory address may be provided by interface 595 in serial.) Where register 110 comprises a parallel register, such as where interface 595 provides the memory address to be verified in parallel, a parallel-to-serial interface or converter 245 is coupled to the output of register 110 so that serial binary signals or bits may be provided to serial comparator 130a. Likewise, as address generator 210 generates memory address locations to be accessed in memory unit 220 the serial binary signals are provided to serial comparator 130a. This may be accomplished by a conventional address generator coupled to a parallel-to-serial converter (not shown), although this would remove the need for converter 235. When a match is detected, serial comparator 130a provides an output signal to trigger 121 of latch 120 as before. As illustrated, the stored electrical signals are provided to latch 120 in parallel, as illustrated in FIG. 1, rather than coupling through converter 225. Timing is synchronized or coordinated through the use of serial address generator 210 and serial comparator 130a. Thus, comparator 130a should signal a match between the address provided by generator 210 and the address stored in register 110 when the stored electrical signals are accessed from memory unit 220.

Although device 11a illustrated in FIG. 2 accesses random access memory 220 at a slower rate than the embodiment illustrated in FIG. 1 due to the additional time required for serial bit processing, a number of advantages may be obtained by use of this particular embodiment. First, smaller data/address buses are required. Likewise, such an embodiment may be useful where the digital processing is serial in nature, such as in copending patent application Ser. No. 08/036,743. In addition, advantages are obtained by the use of a serial comparator rather than a parallel comparator. Serial comparators are cheaper in that they require less hardware and are easier to employ because the timing necessary to make them operate properly is handled externally to the comparator.

Figure 3:
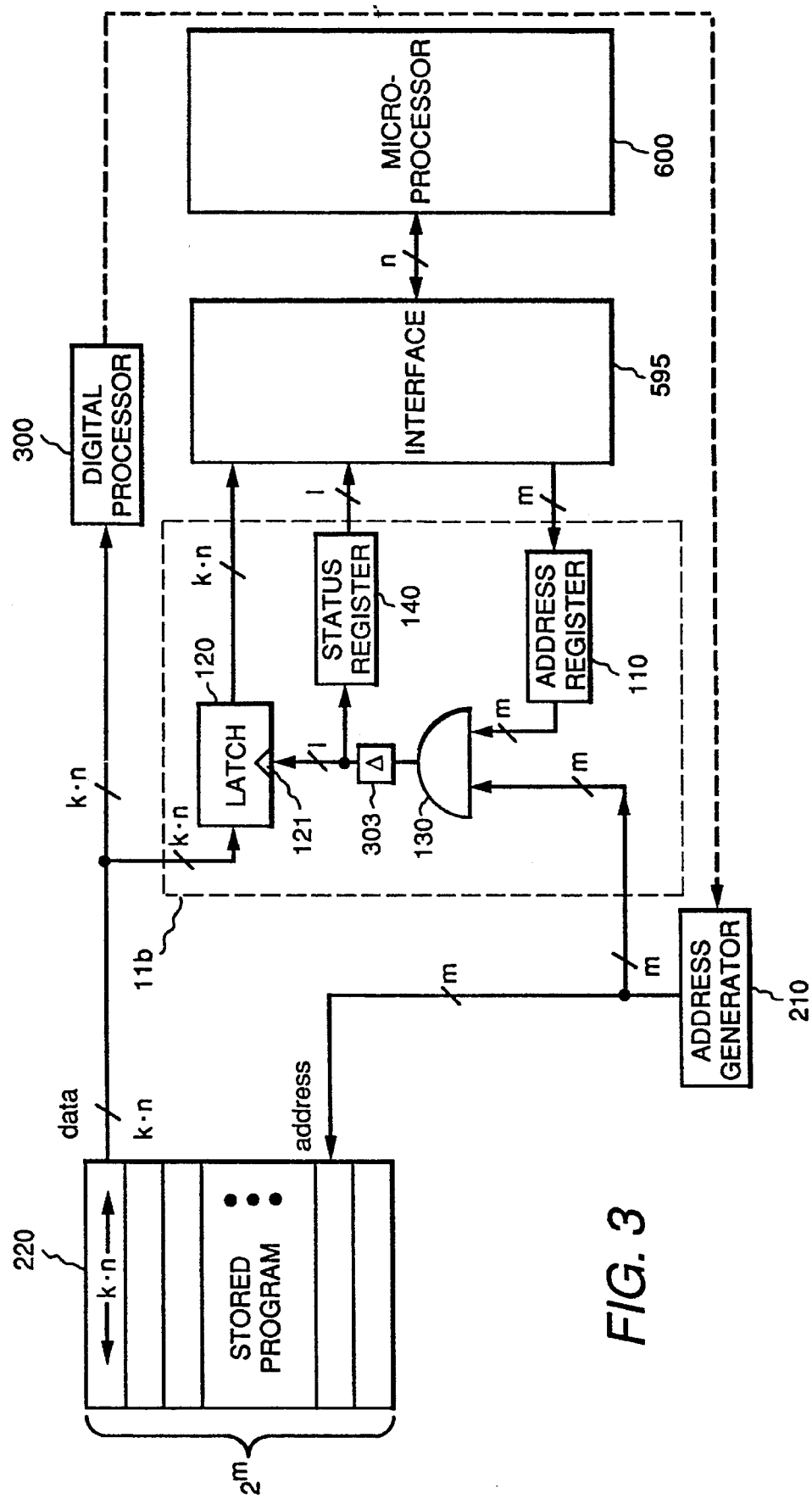
FIG. 3 is a schematic diagram illustrating a second alternative embodiment of a memory storage verification device or system in accordance with the invention.

FIG. 3 illustrates a second alternative embodiment for a memory verification device 11b in accordance with the present invention. This embodiment is also similar to the embodiment illustrated in FIG. 1. A difference between the embodiment illustrated in FIG. 1 and the embodiment illustrated in FIG. 3 is that the embodiment illustrated in FIG. 1 operates in an environment in which the same program or sequence of stored electrical signals is being repetitively executed in accordance with address generator 210. Thus, as previously described, once a predetermined period of time has elapsed, microprocessor 600 communicates with latch 120 to confirm that the electrical signals stored in the memory location accessed are correct. The embodiment illustrated in FIG. 3, however, is intended to be used in situations in which modifiable or adaptive processing takes place so that the order of instruction execution is not predetermined. Thus, as illustrated, processor 300 is coupled to address generator 210, as shown in phantom indicating, that the processor itself may, if desired, control the execution of program instructions in memory unit 220.

In addition to the components illustrated in the embodiment of device 11 in FIG. 1, device 11b in FIG. 3 also includes a status register 140. Thus, in this particular embodiment microprocessor 600, via interface 595, provides a memory address location to be verified. This memory address is stored in register 110, as previously described. Likewise, as address generator 210 accesses various memory locations in accordance with the program being executed, these memory location addresses are provided to comparator 130. Once comparator 130 detects a match between the memory location being accessed and the memory location address stored in register 110 it provides a signal, via time delay 303, to latch 120, as previously described with respect to the embodiment illustrated in FIG. 1; however, in this embodiment it also provides a signal to status register 140. Microprocessor 600 periodically "polls" status register 140 by accepting or receiving a signal via interface 595. Once status register 140 indicates that a match has occurred, microprocessor 600 may access the electrical signals in latch 120 obtained from the memory location accessed by processor 300. Thus, microprocessor 600 may verify the electrical signals stored in that memory location. Likewise, the embodiment illustrated in FIG. 3 may be modified for serial bit processing, as previously described.

Figure 4:
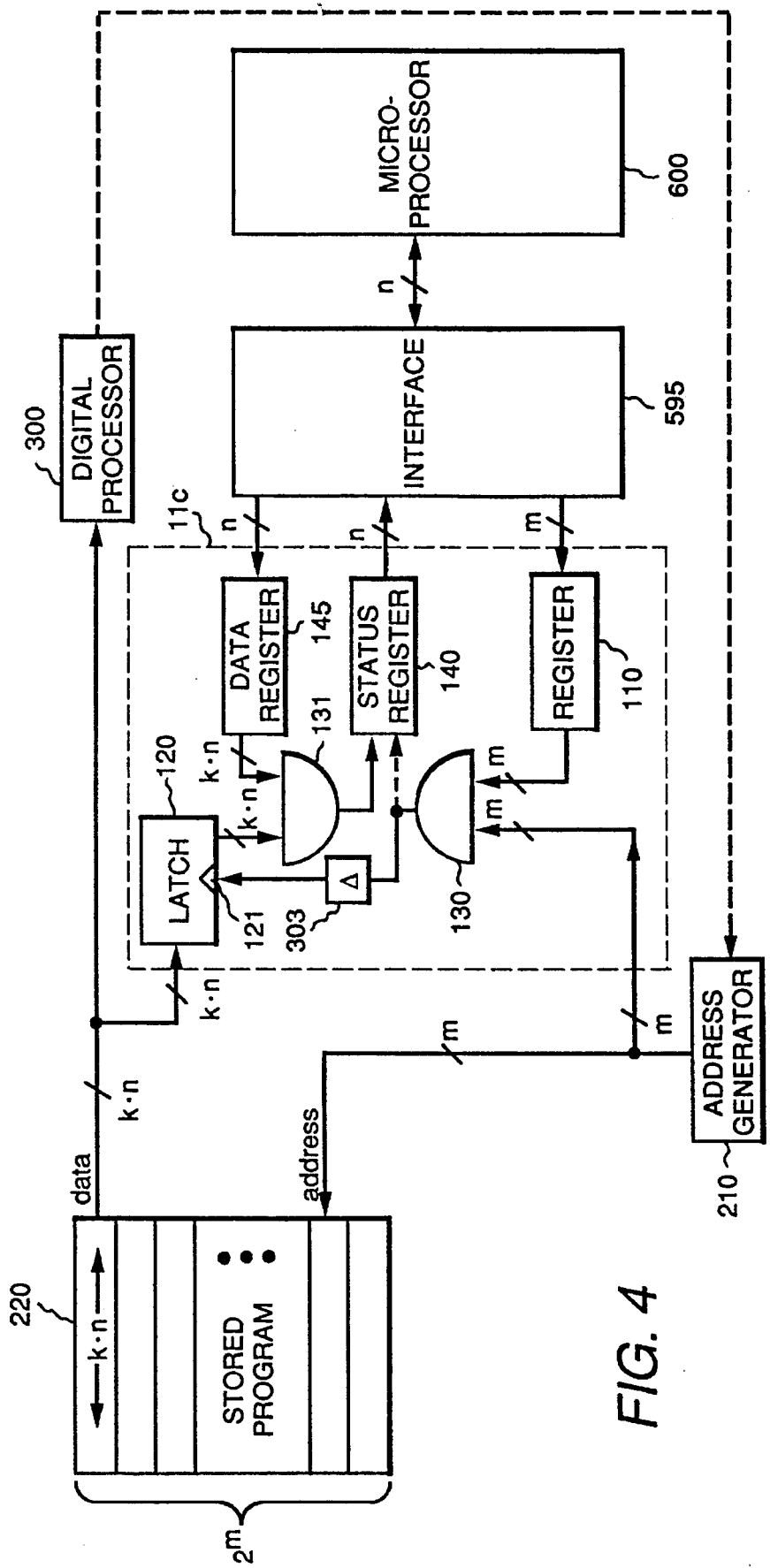
FIG. 4 is a schematic diagram illustrating third and fourth alternative embodiments of a memory storage verification device or system in accordance with the invention.

FIG. 4 illustrates third and fourth alternative embodiments for a memory verification device 11c in accordance with the present invention. A third alternative embodiment is illustrated in FIG. 4 by device 11c, absent the link shown in phantom between comparator 130 and status register 140. The third embodiment is similar to the embodiment illustrated in FIG. 1 with the addition of status register 140, as illustrated in the embodiment in FIG. 3, and the further addition of a data register 145. In previously described embodiments of a memory verification device in accordance with the present invention, the comparison between the electrical signals stored in the accessed memory location and the desired electrical signals was performed by external microprocessor 600; however, in this embodiment by including additional hardware components, such as illustrated in FIG. 4, the comparison may now be made within device 11c. Like device 11 illustrated in FIG. 1, device 11c for this third alternative embodiment is contemplated for use where processor 300 continually executes a periodic or repetitively executed program stored in memory unit 220. Thus, address generator 210 generates a repetitive sequence of addresses. As previously described, the advantage of this embodiment is that after a period of time it is assured that the memory address location to be verified will have been accessed and may be verified. Thus, in the embodiment illustrated in FIG. 11c, once the address location stored in register 110 is accessed by processor 300, comparator 130 detects a match and sends an output signal to trigger 121 of latch 120 via time delay 303. Latch 120 receives the electrical signals stored in the memory location being accessed and provides those electrical signals to comparator 131. Comparator 131 determines whether the electrical signals stored in the memory location accessed match the electrical signals provided to register 145 by microprocessor 600 via interface 595. If a match is determined to have occurred by comparator 131, then that comparator transmits an output signal to status register 140. Microprocessor 600 may check the status of register 140 via interface 595 after the predetermined period of time is determined to have elapsed. If after this time has passed status register 140 does not indicate that a match has occurred, microprocessor 600 may be programmed to take corrective action, as described hereinafter.

A fourth alternative embodiment of a memory verification device 11c in accordance with the invention is illustrated in FIG. 4 and includes the connection or link between comparator 130 and status register 140 where status register 140 comprises at least a two bit register. Thus, in this particular embodiment, as described with respect to the second alternative embodiment and the third alternative embodiment, microprocessor 600 may poll status register 140, as previously described. First, it may poll status register 140 to determine whether the memory location address stored in register 110 has been accessed and then it may poll status register 140 to determined whether a match has occurred between the electrical signals stored in the memory location accessed and the electrical signals stored in register 145. Thus, a fourth alternative embodiment is intended for use in situations such as that described with respect to the second alternative embodiment, that is, where regular cycles of memory address locations are not accessed periodically and where the program executed may be controlled at least in part by processor 300, as illustrated in FIG. 4 by the coupling shown in phantom between processor 300 and address generator 210. Likewise, the third and fourth alternative embodiments may be modified for serial bit processing, as previously described.

Yet another advantage of a memory verification device in accordance with the present invention is due to the operations executed once an error is detected in a stored electrical signal. By way of contrast, another method for detecting an error in a stored electrical signal, such as a conventional checksum technique, might require that the entire program be "reloaded," utilizing significant signal processing resources and likewise resulting in the loss of significant amounts of data during the period in which this reloading occurs. In contrast, once a memory location is discovered in which a stored electrical signal is in error, only that location need be corrected, which would require only microseconds to accomplish with external microprocessor 600. As a result, the loss of any data is minimal and, furthermore, data need not be lost at all due to additional device features described hereinafter.

Figure 5:
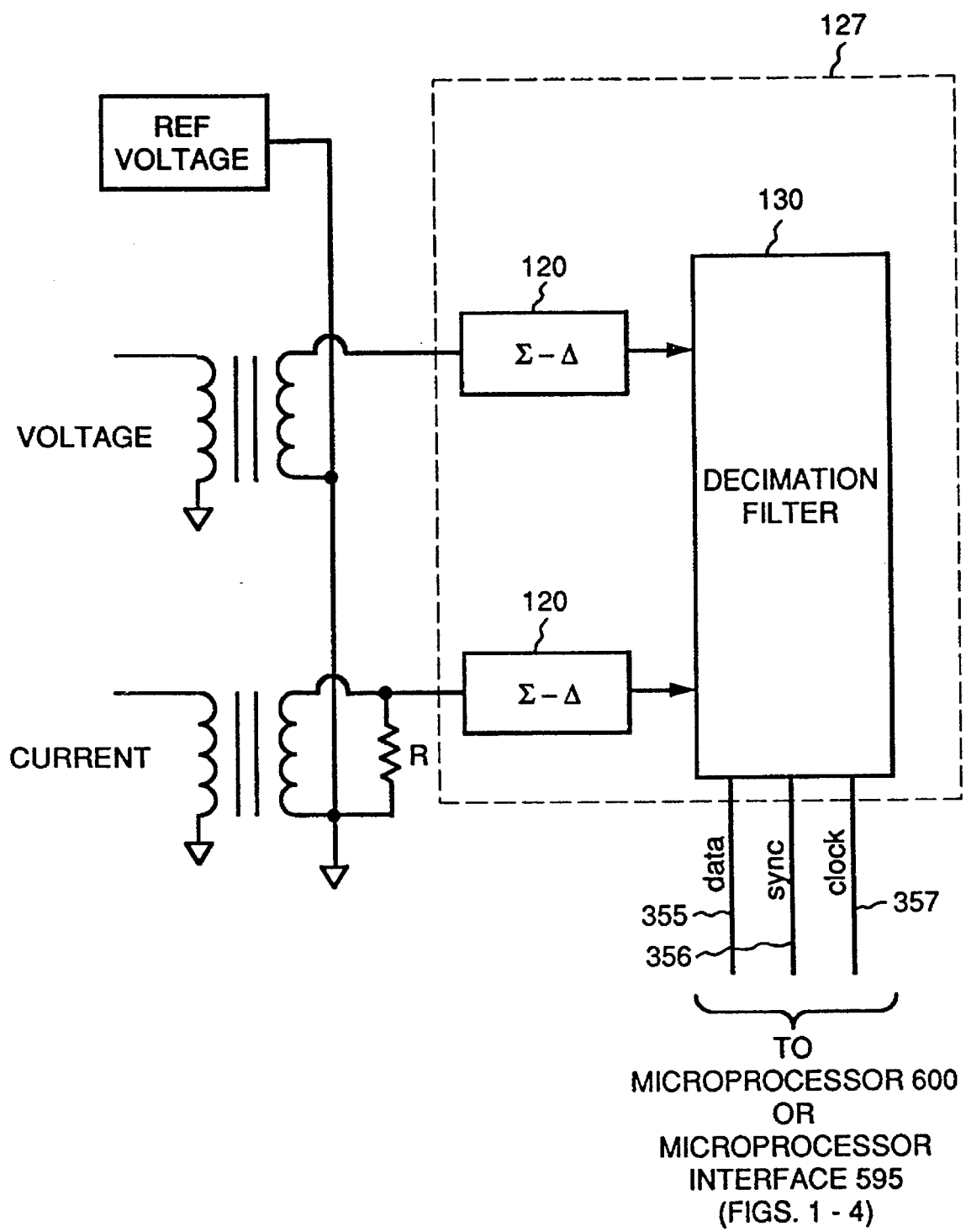
FIG. 5 is a schematic diagram illustrating a portion of yet another embodiment of a memory storage verification device or system in accordance with the invention.

As illustrated in FIG. 5 and described in co-pending patent application Ser. No. 08/036,743, in a typical power measurement, metering and management application, a plurality of substantially continuous, substantially alternating electrical signals are provided to a plurality of analog-to-digital converters and the converters may be coupled to the input ports of a multiply-accumulate processor, such as processor 300 of FIGS. 1–4. Conventional analog-to-digital conversion frequently involves use of oversampled analog-to-digital converters, such as having sigma-delta modulators incorporated therein. Systems in which analog-to-digital converters and sigma-delta modulators may prove useful are described in U.S. Pat. No. 5,181,033 entitled "Digital Filter for Filtering and Decimating Delta Sigma Modulator Output Signals," by Yassa et al., issued Jan. 19, 1993, U.S. Pat. No. 5,126,961, entitled "Plural-Channel Decimator Filter, as for Sigma-Delta Analog-to-Digital Converters," by Garverick, issued Jun. 30, 1992, U.S. Pat. No. 5,134,578, entitled "Digital Signal Processor for Selectively Performing Cordic, Division or Square-Rooting Procedures," by Garverick et al., issued Jul. 28, 1992, U.S. Pat. No. 4,951,052, entitled "Correction of Systematic Error in the Oversampled Analog-to-Digital Converters," by Jacob et al , issued. Aug. 21, 1990, and U.S. Pat. No. 4,896,156, entitled "Switched-Capacitance Coupling Network for Differential-Input Amplifiers Not Requiring Balanced Input Signals," by Garverick, issued Jan. 23, 1990, all of the foregoing patents being assigned to the assignee of the present invention and herein incorporated by reference, and described in "A Programmable Mixed Signal ASIC for Power Metering," by S. L. Garverick, K. Fujino, D. T. McGrath, and R. D. Baertsch, IEEE Journal of Solid State Circuits, Vol. 26, No. 12, Dec. 1991, pp. 2008–16, and "A Programmable Mixed Signal ASIC for Power Management," by D. T. McGrath, P. Jacob, and H. Sailer, IEEE 1992 Custom Integrated Circuits Conference, pp. 19.4.1–19.4.2, both of which are herein incorporated by reference.

Figure 6:
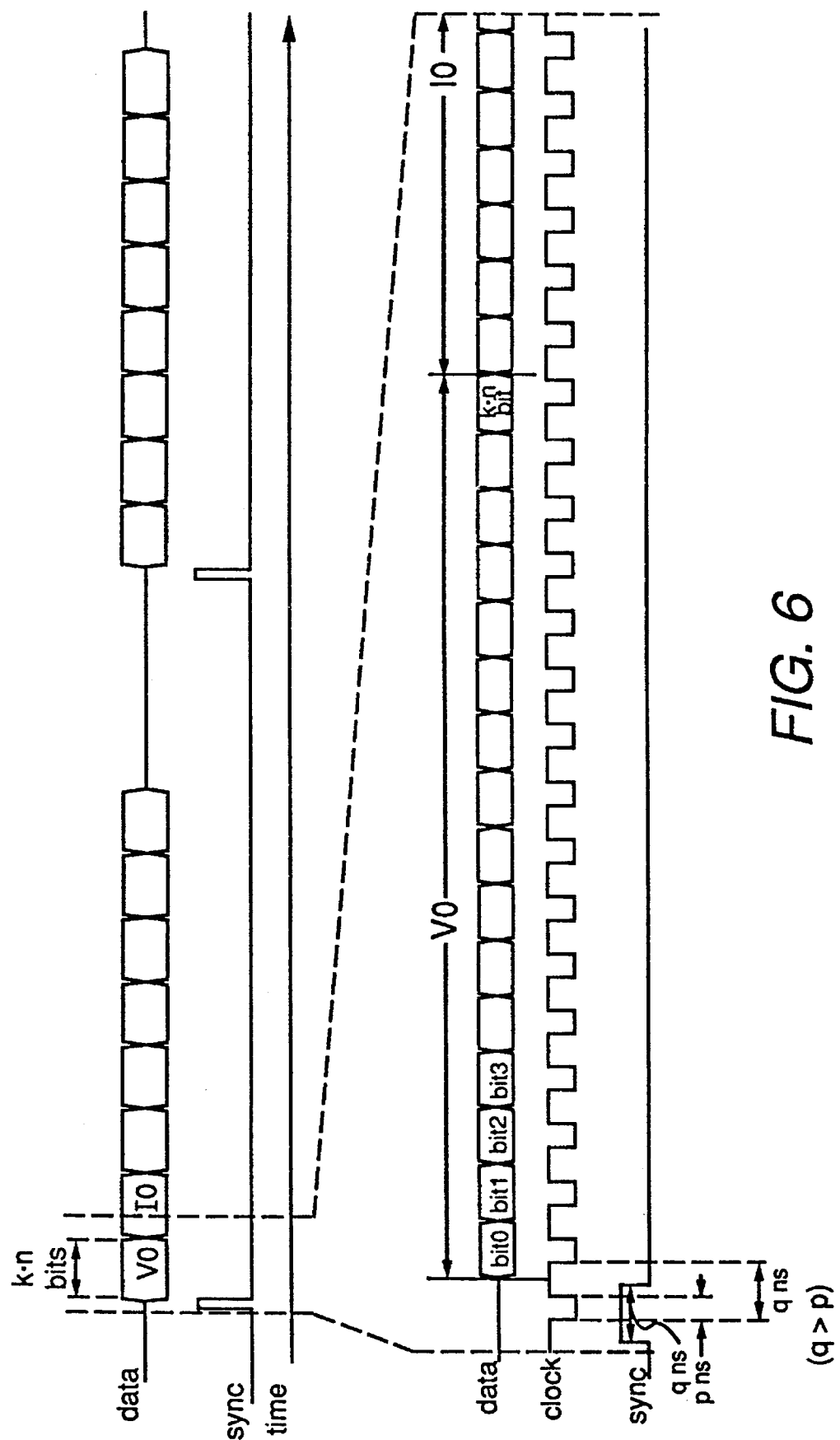
FIG. 6 is a diagram illustrating waveforms providing timing signals for the portion of the embodiment of a memory storage verification device or system in accordance with the invention illustrated in FIG. 5.

In a signal processor as described in co-pending patent application Ser. No. 08/036,743, an additional feature to enhance reliability and integrity without the loss of power measurement data or signals would include coupling the output ports of such analog-to-digital (A/D) converters, such as an A/D converter 127 illustrated in FIG. 5, to a microprocessor, such as microprocessor 600 of FIGS. 1–4, typically through a microprocessor interface, such as interface 595, during the period in which processor 300 is not performing operations. Thus, for example, in any of the embodiments illustrated in FIGS. 1–4, during the period in which microprocessor 600 is correcting an error in the stored electrical signals in memory unit 220, signals typically provided to processor 300 in the ordinary course of its operation may be provided directly to the microprocessor instead. This is illustrated in FIG. 5 in which analog electrical signals, such as voltage or current, are provided to sigma-delta modulators 120. The modulators are coupled to a decimation filter, such as described in co-pending patent applications Ser. No. 07/653,935(RD-20,882), or Ser. No. 08/025,456. As illustrated and described in co-pending patent application Ser. No. 08/036,743, the electrical signals or data are available through pins or couplings 355, 356, and 357, providing respectively, digital or quantized power signal measurements, synchronization pulses, and clock pulses. These waveforms are respectively illustrated in FIG. 6, where VO designates a voltage measurement and IO designates a current measurement. It will be appreciated that the invention is not limited in scope to the particular waveforms illustrated.

Many additional advantages flow from this scheme. First, the microprocessor may continually monitor the power signals to make sure that no significant power surges take place during the period in which the microprocessor is correcting stored electrical signals. A further advantage derives from the fact that ordinarily to correct the stored electrical signals, the power source must be taken "off line." Utilizing any one of the embodiments illustrated in FIGS. 1 to 4 and in conjunction with the embodiment illustrated in FIG. 5, the fault or error may be corrected without shutting down the power, and power signal measurements may be continually monitored and stored while the electrical signal is corrected. Thus, safety is enhanced by the capability to monitor power during a period in which the processor is not in operation. In addition, the ability to store the electrical signals and perform later signal reduction or analysis on data produced during the period in which processor 300 has been decoupled is a significant advantage, although this period of time may be short.

A memory storage verification device such as previously described operates in accordance with the following method. Predetermined or selected memory locations are accessed in a memory storage device by an external processor. At least one selected memory location address is stored, such as in register 110 in device 11 (FIGS. 1–4), as previously described. Next, the selected memory location address is electronically compared with the memory location address being accessed by the processor until the selected memory location address matches the accessed memory location address. This may be accomplished by comparator 130 in device 11, as previously described. Likewise, the selected memory location address and the accessed memory location address may be compared either serially or in parallel, as previously described. Typically, the selected memory location address is stored as a binary electrical signal. Once the selected memory location address matches the accessed memory location address, the stored electrical signals from the matched memory location are transferred for verification while the location is being accessed by the external processor. This may be accomplished by latch 120 in device 11, as previously described. Likewise, the stored electrical signal may be transferred either serially or in parallel, depending upon the particular embodiment.

While only certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A memory storage verification system for use with a memory unit in which electrical signals stored in memory locations are accessed by an external processor, said system comprising:

a register having an input port and an output port, said register for storing the address of a memory location in said memory unit having a stored electrical signal;

a comparator coupled to said register through said output port for comparing the memory location address stored in said register with an electrical signal from said memory unit providing the address of the memory location in said memory unit accessed by the external processor, said comparator being adapted to provide an output signal on an output port when the memory location address stored in said register corresponds to the address provided by the electrical signal from said memory unit;

a latch having an input port, an output port and a trigger coupled to the output port of said comparator, the input port of said latch being coupled to said memory unit and being adapted to receive the electrical signal stored in said memory location accessed when said trigger receives the comparator output signal; and a microprocessor interface wherein the input port of said register is coupled to an external microprocessor through said microprocessor interface for receiving the memory location address being stored in said register;

said memory unit being coupled to an external address generator adapted to provide the memory address location of the stored electrical signals in said memory unit that am accessed, said comparator comprising a parallel comparator having two input ports, the first input port being coupled to said register and the second input port being coupled to the address generator.

2. The system of claim 1, wherein the output port of said latch is coupled to the external microprocessor through said microprocessor interface.

3. The system of claim 2, wherein said memory unit comprises a random access memory.

4. The system of claim 3, and further comprising a monolithic electronic circuit chip;

wherein said random access memory and said memory verification device are incorporated into said chip.

5. The system of claim 1 and further comprising a time delay device providing a delay substantially corresponding to the interval between when a particular memory location address is provided to the memory unit by the memory address generator and when the electrical signal stored in the memory location corresponding to the particular memory location address is received from the memory unit;

said time delay device coupling the output port of said comparator to the trigger of said latch.

6. The system of claim 5, and further comprising a status register coupled to the output port of said comparator through said time delay device;

said status register being coupled to the external microprocessor by said microprocessor interface.

7. The system of claim 6, wherein the output port of said latch is coupled to the external microprocessor through said microprocessor interface.

8. The system of claim 1, and further comprising a parallel-to-serial converter having an input port and an output port;

said memory unit being coupled to a serial address generator for providing serially on an output port the memory address location of the stored electrical signals in the memory unit that are accessed;

said register having an output port coupled to the input port of said parallel-to-serial converter;

said comparator comprising a serial comparator having two input ports, the first input port being coupled to the output port of said parallel-to-serial converter and the second input port being coupled to the output port of said generator.

9. The system of claim 8, and further comprising a time delay device providing a delay substantially corresponding to the interval between when a particular memory location is provided to the memory unit by the memory address generator and when the electrical signal stored in the memory location corresponding to the particular memory location address is received from the memory unit;

said time delay device coupling the output port of said comparator to the trigger of said latch.

10. The system of claim 9, and further comprising an additional parallel-to-serial converter coupled to the memory unit for receiving the electrical signals stored in said memory location that is accessed when said trigger receives the comparator output signal;

said additional parallel-to-serial converter coupling the memory unit to the external processor.

11. The system of claim 9, and further comprising a second register having an input port and an output port, a second comparator, and a status register;

the input port of said second register being coupled to the external microprocessor through said microprocessor interface;

said second comparator having two input ports and an output port, the first of said second comparator input ports being coupled to the output port of said latch, the second of said second comparator input ports being coupled to the output port of said second register;

the output port of said second comparator being coupled to said status register;

said status register being coupled to the external microprocessor through said microprocessor interface.

12. The system of claim 11, wherein said status register comprises at least two memory locations coupled to the external microprocessor through said microprocessor interface;

the first memory location being coupled to the output port of said second comparator;

the second memory location being coupled to the output port of said first comparator through said time delay device.

13. The system of claim 1, wherein the address generator comprises a binary counter.

* * * * *